United States Patent [19]

Sano et al.

[11] Patent Number: 5,362,597
[45] Date of Patent: Nov. 8, 1994

[54] RADIATION-SENSITIVE RESIN COMPOSITION COMPRISING AN EPOXY-CONTAINING ALKALI-SOLUBLE RESIN AND A NAPHTHOQUINONE DIAZIDE SULFONIC ACID ESTER

[75] Inventors: Kimiyasu Sano; Osahiko Tomomitsu; Masayuki Endoh, all of Yokohama; Yasuaki Yokoyama, Yokkaichi, all of Japan

[73] Assignee: Japan Synthetic Rubber Co., Ltd., Tokyo, Japan

[21] Appl. No.: 888,635

[22] Filed: May 27, 1992

[30] Foreign Application Priority Data

May 30, 1991 [JP] Japan ................. 3-153729
Dec. 11, 1991 [JP] Japan ................. 3-350470

[51] Int. Cl.$^5$ ................. G03F 7/023; G03F 7/30
[52] U.S. Cl. ................. 430/191; 430/165; 430/192; 430/193; 430/280; 430/910
[58] Field of Search ........... 430/280, 191, 192, 193, 430/165, 910; 526/271, 318.2, 318.45, 346

[56] References Cited

U.S. PATENT DOCUMENTS

| | | | |
|---|---|---|---|
| 4,299,911 | 11/1981 | Ochi et al. | 430/280 |
| 4,377,631 | 3/1983 | Toukhy et al. | 430/192 |
| 4,384,037 | 5/1983 | Hosaka et al. | 430/192 |
| 4,427,760 | 1/1984 | Nagazawa et al. | 430/280 |
| 4,493,884 | 1/1985 | Nagano et al. | 430/191 |
| 4,550,069 | 10/1985 | Pampalone | 430/165 |
| 4,738,915 | 4/1988 | Komine et al. | 430/192 |
| 4,929,536 | 5/1990 | Spak et al. | 430/193 |
| 4,946,757 | 8/1990 | Seio et al. | 430/192 |
| 5,112,719 | 5/1992 | Yamada et al. | 430/192 |

FOREIGN PATENT DOCUMENTS

| | | |
|---|---|---|
| 0307828 | 3/1989 | European Pat. Off. |
| 0428398 | 5/1991 | European Pat. Off. |
| 0430477 | 6/1991 | European Pat. Off. |
| WO87/03706 | 6/1987 | WIPO |

Primary Examiner—Charles L. Bowers, Jr.
Assistant Examiner—John S. Chu
Attorney, Agent, or Firm—Oblon, Spivak, McClelland, Maier & Neustadt

[57] ABSTRACT

A radiation-sensitive resin composition comprising:
(a) an epoxy group-containing alkali-soluble resin, or a combination of an alkali-soluble resin which may have an epoxy group and an epoxy compound,
(b) 1,2-naphthoquinonediazide sulfonic acid ester, and
(c) a solvent.

The above radiation-sensitive resin composition is useful as a material for forming a lens.

13 Claims, No Drawings

RADIATION-SENSITIVE RESIN COMPOSITION COMPRISING AN EPOXY-CONTAINING ALKALI-SOLUBLE RESIN AND A NAPHTHOQUINONE DIAZIDE SULFONIC ACID ESTER

DETAILED DESCRIPTION OF THE INVENTION

The present invention relates to a radiation-sensitive resin composition. More specifically, it relates to a radiation-sensitive resin composition for use as a material for forming a coating in an optical device or as a suitable material for forming a microfocusing lens or a lens array formed of a regularly arranged lenses.

An overcoat is conventionally widely used to prevent a display device or a solid camera device from deteriorating or suffering damage. In the production of a display device, a protective coating layer formed from an overcoat material is sometimes immersed in a solvent, an acid solution or an alkali solution during the production thereof, or its surface is sometimes locally exposed to a high-temperature during the formation of a printed electrode layer by sputtering treatment. Therefore, an overcoat is required not to be deteriorated under such severe conditions. Such an overcoat is required to have performances such as high adhesion to a substrate or an undercoat layer, flatness and toughness as a coating, clearness, high heat resistance and high light resistance so as to prevent alterations such as coloring, yellowing and whitening and excellence in water resistance, solvent resistance, acid resistance and alkali resistance.

As a material capable of forming an overcoat which satisfies the above requirements, there has been known a composition disclosed in Japanese Laid-open Patent Application No. 217230/1985. This material is widely used to form a surface overcoat for a color liquid crystal display device having a built-in color separation filter or a color solid camera device or to form a flat overcoat on the device surface.

When a conventional overcoat material used in a display device or a solid camera device is applied by a spin coating method, the resultant film on a substrate has a larger thickness in a marginal area than in other places. This deteriorates the accuracy of the cell gap adjustment essential for sticking substrates together in producing a display device, which results in problems such as a decrease in an output of the display device production and complication in a working step of cell gap adjustment.

Further, there arises a problem concerning the adhesion between a sealing agent and the overcoat. The adhesion between a sealing agent and the overcoat varies depending upon what kind of a sealing agent is used. This affects reliability of the display device.

In order to overcome the above problems, it is required to remove those portions (a portion having a different thickness and a portion to be brought into contact with a sealing agent) of the overcoat which be unnecessary for tile production of a panel. The unnecessary portions of the overcoat are generally removed, for example, by a method in which a photoresist having excellent resistance to dry-etching is coated on the overcoat, exposed through a proper pattern and developed, and then the photoresist is dry-etched.

However, the defect of this method is that the used photoresist is required to be removed after the dry etching, and the panel production step is therefore complicated. Furthermore, the display device may be adversely affected by the dry etching.

A radiation-sensitive resin composition is also used as a material for producing a microfocusing lens on a solid camera device or a liquid crystal display device. With a decrease in an effective charge due to a decreasing size of the device elements in recent years, such a radiation-sensitive resin composition aims to improve the light-gathering ratio (improvement in sensitivity) by the formation of a microfocusing lens on a display device.

The above microfocusing lens that is practically used includes a refractive index distribution type flat microfocusing lens produced by an ion-exchange method and a convex microfocusing lens produced from a photosensitive glass.

The processes for the production of these practically used microfocusing lenses are all complicated, and the production thereof therefore requires a high cost. Further, there is a problem in that the lens cannot be integrated into other portion at its production step due to the limitation derived from their production method. Moreover, the refractive index distribution type flat microfocusing lens produced by an ion exchange method is required to be surface-polished, and the convex microfocusing lens produced from a photosensitive glass has a problem in that it is shaped only to a predetermined form. In recent years, therefore, it has been attempted to form a microfocusing lens by a method in which a resist pattern is formed from a resin composition and then the resist pattern is melt-flowed by heat treatment.

In order to improve the sensitivity of a solid camera device and a liquid crystal display device, a method has been recently proposed in which a microfocusing lens is produced from a radiation-sensitive resin.

Japanese Laid-open Patent Publication No. 246505/1989 discloses a method for forming a microfocusing lens in which a transparent photosensitive resin is coated on an overcoat and exposed and developed such that the resin remain in portions corresponding to a photo diode, and then the resultant pattern is melt-flowed by heat. However, the form of the so-obtained microfocusing lens depends on the conditions for heat-treatment, and it is difficult to produce a microfocusing lens having a form as required. Further, the heat deformation resistance and transparency of the so-produced microfocusing lens still remain to be resolved.

It is an object of the present invention to provide a novel radiation-sensitive resin composition.

It is another object of the present invention to provide a radiation-sensitive resin composition which not only satisfies the properties required of conventional overcoats but also permits easy removal of unnecessary portions causing a problem in producing a panel, by exposure and development.

It is further another object of the present invention to provide a radiation-sensitive resin composition which hardly depends on the conditions for heat treatment in producing a microfocusing lens having any form as required and which can give a lens excellent in heat deformation resistance, solvent resistance and transparency.

Other objects and advantages of the present invention will be apparent from the following description.

According to the present invention, the above objects and advantages of the present invention are achieved, first, by a radiation-sensitive resin composition comprising:
- (a1) an epoxy group-containing alkali-soluble resin,
- (b) 1,2-naphthoquinonediazide sulfonic acid ester, and
- (c) a solvent.

The epoxy group-containing alkali-soluble resin (a1) reacts, under heat, with a carboxyl group of an indenecarboxylic acid which is formed from 1,2-naphthoquinonediazide sulfonic acid ester under exposure to radiation. As a result, an overcoat having both heat resistance and solvent resistance is formed from the above resin composition of the present invention.

As the epoxy group-containing alkali-soluble resin (a1), preferred is a resin which has an epoxy group and which is also imparted with alkali-solubility owing to the presence of a carboxyl group or an acid anhydride group.

When the above alkali-soluble resin (a1) is prepared by subjecting a two-component system of an unsaturated carboxylic acid or acid anhydride and a radical-polymerizable compound having an epoxy group to a radical polymerization, the epoxy group and the unsaturated carboxylic acid or acid anhydride undergo a reaction during a radical polymerization, and consequently, the polymerization system is crosslinked and gelled. Therefore, it is required to incorporate other radical-polymerizable compound as a third component to inhibit the reaction between the epoxy group and the carboxylic acid or acid anhydride. As this "other radical-polymerizable compound", preferred is a monoolefinic unsaturated compound.

Further, by incorporating a monoolefinic unsaturated compound as the third component, the mechanical properties of the resulting resin can be properly controlled, and the solubility in an alkali aqueous solution can be adjusted.

The unsaturated carboxylic acid includes monocarboxylic acids such as acrylic acid, methacrylic acid and crotonic acid; and dicarboxylic acids such as maleic acid, fumaric acid, citraconic acid, mesaconic acid and itaconic acid, and preferred are acrylic acid and methacrylic acid. The unsaturated carboxylic acid anhydride includes maleic acid anhydride and itaconic acid anhydride, and maleic anhydride is preferably used.

The radical-polymerizable compound having an epoxy group includes glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, N-[4-(2,3-epoxypropoxy)-3,5-dimethylbenzyl]acrylamide and N-[4-(2,3-epoxypropoxy)-3,5-dimethylphenylpropyl]acrylamide.

The above monoolefinic unsaturated compound includes methacrylic acid alkyl esters such as methyl methacrylate, ethyl methacrylate, n-butyl methacrylate, sec-butyl methacrylate and t-butyl methacrylate; acrylic acid alkyl esters such as methyl acrylate and isopropyl acrylate; methacrylic acid cycloalkyl esters such as cyclohexyl methacrylate, 2-methylcyclohexyl methacrylate, dicyclopentanyl methacrylate, dicyclopentanyloxyethyl methacrylate and isobornyl methacrylate; acrylic acid cycloalkyl esters such as cyclohexyl acrylate, 2-methylcyclohexyl acrylate, dicyclopentanyl acrylate, dicyclopentanyloxyethyl acrylate and isobornyl acrylate; methacrylic acid aryl esters such as phenyl methacrylate and benzyl methacrylate; acrylic acid aryl esters such as phenyl acrylate and benzyl acrylate; dicarboxylic acid diesters such as diethyl maleate, diethyl fumarate and diethyl itaconate; styrene α-methylstyrene, o-methylstyrene, m-methylstyrene, p-methylstyrene, vinyl toluene, p-methoxystyrene, etc. Among these compounds, preferred are methylmethacrylate, dicyclopentanyl methacrylate isobornyl methacrylate, isobornyl acrylate and styrene.

The above unsaturated carboxylic acids may be used alone or in combination. The above unsaturated carboxylic acid anhydrides may be used alone or in combination. The above radical-polymerizable compounds having an epoxy group may be used alone or in combination. The above monoolefinic unsaturated compounds may be used alone or in combination.

The proportion of the radical-polymerizable compound having an epoxy group for the production of the copolymer is preferably 10 to 70% by weight, particularly preferably 20 to 50% by weight. When this proportion is less than 10% by weight, the above radical-polymerizable compound does not fully undergo a reaction with the carboxyl group of an indenecarboxylic acid which is formed from a radiation-sensitive acid-forming compound by irradiation with radiation, and the heat resistance of a pattern obtained from the composition is not sufficient. When the above proportion exceeds 70% by weight, the alkali-soluble resin is liable to cause a problem concerning its storage stability.

The proportion of the unsaturated carboxylic acid or the unsaturated carboxylic acid anhydride for the production of the copolymer is preferably 5 to 40% by weight, particularly preferably 10 to 30% by weight. When this proportion is less than 5% by weight, it is difficult to dissolve the resultant copolymer in an alkaline aqueous solution, and the resin is likely to remain after the development. It is hence difficult to form a satisfactory pattern. When the above proportion exceeds 40% by weight, the resultant copolymer has too high a solubility in an alkaline aqueous solution, and it is difficult to prevent the dissolution of a portion not-irradiated with radiation.

The proportion of the monoolefinic unsaturated compound for the production of the copolymer is 10 to 70% by weight, particularly preferably 30 to 50% by weight. When this proportion is less than 10% by weight, gelation is liable to occur during the polymerization. When it exceeds 70% by weight, the amounts of the radical-polymerizable compound having an epoxy group and the unsaturated carboxylic acid or the unsaturated carboxylic acid anhydride become low relatively to the monoolefinic unsaturated compound. As a result, the solubility of the resin in an alkaline aqueous solution might decrease, or a pattern obtained from the composition might show insufficient heat resistance.

The solvent used for the production of the above alkali-soluble resin by polymerization includes alcohols such as methanol and ethanol; ethers such as tetrahydrofuran, glycol ethers such as ethylene glycol monomethyl ether; cellosolve esters such as methyl cellosolve acetate; and other aromatic hydrocarbons, ketones and esters.

For the radical polymerization, a general radical-polymerization initiator may be used as a polymerization catalyst. The radical-polymerization initiator includes azo compounds such as 2,2'-azobisisobutyronitrile, 2,2'-azobis-(2,4-dimethylvaleronitrile and 2,2'-azobis(4-methoxy-2,4-dimethylvaleronitrile); organic peroxides such as benzoyl peroxide, lauroyl peroxide, t-butyl peroxypivalate and 1,1-bis-(t-butylperoxy)cyclohexane; and hydrogen peroxide. When the peroxide is used as a radical-polymerization initiator, it may be combined with a reducing agent to form a redox-type initiator.

The epoxy group-containing alkali-soluble resin obtained by the copolymerization of the above unsaturated carboxylic acid, unsaturated carboxylic acid anhydride, radical-polymerizable compound having an epoxy group and monoolefinic unsaturated compound has a structure in which structural units formed by the cleavage of carbon-carbon double bonds of these monomer are randomly combined.

The molecular weight and distribution of the alkali-soluble resin are not specially limited as far as a solution of the composition of the present invention can be uniformly applied.

The alkali-soluble resin (a1) preferably comprises a structural unit of the formula (a)-1,

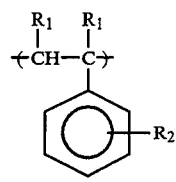
(a)-1 wherein two $R_1$'s are identical with, or different from, each other and each is a hydrogen atom or an alkyl group having 1 to 4 carbon atoms, and $R_2$ is a hydrogen atom, a methyl group or a methoxy group,
a structural unit of the formula (a)-2,

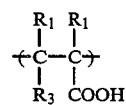
(a)-2 wherein $R_1$ is as defined above and $R_3$ is a hydrogen atom or a carboxyl group,
a structural unit of the formula (a)-3,

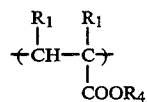
(a)-3 wherein $R_1$ is as defined above, and $R_4$ is an alkyl group having 1 to 20 carbon atoms, a cycloalkyl group having 5 to 20 carbon atoms, or an aryl group having 6 to 12 carbon atoms,
and a structural unit of the formula (a)-4,

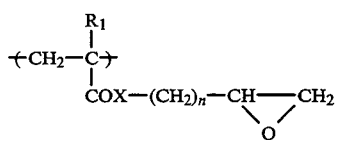
(a)-4 wherein $R_1$ is as defined above, X is —O— or a group of the following formula

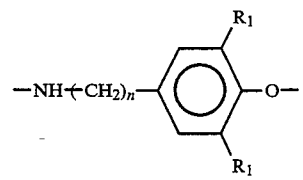

(wherein $R_1$ and n are as defined above), and n is an integer of 1 to 10.

On the basis of the total amount of the above structural units (a)-1, (a)-2, (a)-3 and (a)-4, the total weight of the structural units (a)-1 and (a)-3 is 10 to 70% by weight, the amount of the structural unit (a)-2 is 5 to 40% by weight, and the amount of the structural unit (a)-4 is 10 to 70% by weight.

As another example, the epoxy group-containing alkali-soluble resin (a1) particularly preferably comprises the above structural units (a)-1, (a)-3 and (a)-4 and a structural unit of the formula (a)-5,

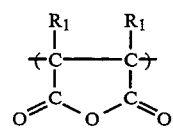
(a)-5 wherein $R_1$ is as defined above.

On the basis of the total weight of the structural units (a)-1, (a)-3, (a)-4 and (a)-5, the total amount of the structural units (a)-1 and (a)-3 is 10 to 70% by weight, the amount of the structural unit (a)-5 is 5 to 40% by weight, and the amount of the structural unit (a)-4 is 10 to 70% by weight.

As the above 1,2-naphthoquinonediazide sulfonic acid ester (b), preferred is a compound of the formula (b)-1,

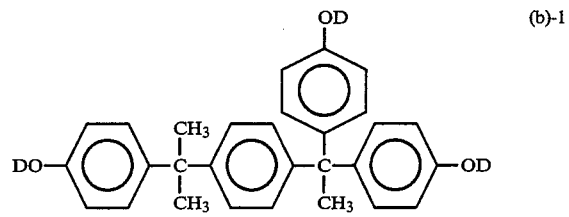
(b)-1 wherein D's are hydrogen atoms, 1,2-naphthoquinonediazide-4-sulfonyl or 1,2-naphthoquinonediazide-5-sulfonyl, provided that all of D's cannot be hydrogen atoms,
or a compound of the formula (b)-2,

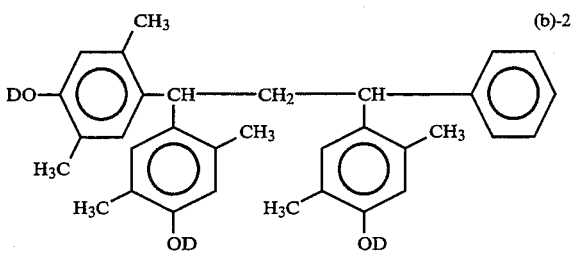
(b)-2 wherein D's are as defined above.

That is, the compound of the above formula (b)-1 is a compound in which at least one hydroxyl group of 4,4'-[1-[4-(1-(4-hydroxyphenyl)-1-methylethyl)phenyl-]ethylidene]diphenol forms 1,2-naphthoquinonediazide-4-or -5-sulfonic acid ester. The compound of the above formula (b)-2 is a compound in which at least one hydroxyl group of 1,1,3-tris(2,5-dimethyl-4-hydroxyphenyl)-3-phenylpropane forms 1,2-naphthoquinonediazide-4- or -5-sulfonic acid ester.

These naphthoquinonediazide sulfonic acid esters may be used alone or in combination.

The amount of the above radiation-sensitive acid-forming compound such as a compound of the formula (b)-1 or (b)-2 for use per 100 parts by weight of the alkali-soluble resin is preferably 5 to 100 parts by weight, particularly preferably 10 to 50 parts by weight. When this amount is less than 5 parts by weight, the amount of acid generated by the absorption of radiation is too small to make a difference between the solubility in an alkaline aqueous solution before the irradiation with radiation and the solubility after the irradiation, and patterning is difficult. Further, since the amount of acid which takes part in the reaction with an epoxy group is small, the heat resistance and solvent resistance of a pattern obtained from the composition may be defective. When the above amount exceeds 100 parts by weight, a major part of the radiation-sensitive acid-forming compound remains as it is after the irradiation with radiation for a short period of time, and the effect of insolubilization in an alkaline aqueous solution sometimes remains too high to develop the pattern.

The composition of the present invention further contains the solvent (c). The solvent will be described later.

A study of the present inventors has also showed that even if a resin having no epoxy group is used as an alkali-soluble resin, the use of such a resin with an epoxy compound in combination gives a resin composition having the same properties as those of the above resin composition of the present invention.

That is, according to the present invention, there is also provided a radiation-sensitive resin composition comprising:
(a) an alkali-soluble resin which may have an epoxy group,
(d) an epoxy compound,
(b) 1,2-naphthoquinonediazide sulfonic acid ester, and
(c) a solvent.

The alkali-soluble resin (a) which may have an epoxy group includes an epoxy group-containing alkali-soluble resin (a1) and an alkali-soluble resin containing no epoxy group (a2).

The epoxy group-containing alkali-soluble resin (a1) includes those which described already.

The epoxy group-containing alkali-soluble resin (a1) here also particularly preferably comprises the structural units of the foregoing formulae (a)-1, (a)-2, (a)-3 and (a-4), in which, on the basis of the total amount of the structural units (a)-1, (a)-2, (a)-3 and (a)-4, the total weight of the structural units (a)-1 and (a)-3 is 10 to 70% by weight, the amount of the structural unit (a)-2 is 5 to 40% by weight, and the amount of the structural unit (a)-4 is 10 to 70% by weight, or comprises the above structural units (a)-1, (a)-3 and (a)-4 and a structural unit of the formula (a)-5 in which, on the basis of the total weight of the structural units (a)-1, (a)-3, (a)-4 and (a)-5, the total amount of the structural units (a)-1 and (a)-3 is 10 to 70% by weight, the amount of the structural unit (a)-5 is 5 to 40% by weight, and the amount of the structural unit (a)-4 is 10 to 70% by weight.

The alkali-soluble resin containing no epoxy group (a2) preferably includes a copolymer obtained from at least one of the foregoing unsaturated carboxylic acids, at least one of the foregoing unsaturated carboxylic acid anhydrides and at least one of the foregoing monoolefinic unsaturated compounds. The proportion of the unsaturated carboxylic acid or the unsaturated carboxylic acid anhydride for the production of the copolymer is preferably 5 to 40% by weight, particularly preferably 15 to 30% by weight. When this proportion is less than 5% by weight, it is difficult to dissolve the resultant copolymer in an alkaline aqueous solution, and the resin is likely to remain after the development. It is hence difficult to form a satisfactory pattern. When the above proportion exceeds 40% by weight, the resultant copolymer has too high a solubility in an alkaline aqueous solution, and it is difficult to prevent the dissolution of a non-irradiated portion.

The proportion of the monoolefinic unsaturated compound for the production of the copolymer is preferably 60 to 95% by weight, particularly preferably 70 to 85% by weight, in view of the influence of the monoolefinic unsaturated compound on the various properties. When this proportion is less than 60% by weight, the proportion of other component(s) of a base polymer, i.e., the unsaturated carboxylic acid or unsaturated acid anhydride increases. As a result, it is difficult to control the mechanical properties of the alkali-soluble resin and the alkali developability. When the above proportion exceeds 95% by weight, the solubility of the alkali-soluble resin in an alkaline aqueous solution undesirably decreases relatively.

The above alkali-soluble resin can be produced in the presence of the foregoing polymerization solvent and polymerization catalyst.

The above alkali-soluble resin having no epoxy group obtained by the polymerization of the unsaturated carboxylic acid, unsaturated carboxylic acid anhydride and monoolefinic unsaturated compound has a structure in which structural units formed by cleavage of carbon-carbon double bonds of these monomers are randomly combined.

The molecular weight and distribution of the alkali-soluble resin are not specially limited as far as a solution of the composition of the present invention can be uniformly applied.

The above alkali-soluble resin having no epoxy group (a2) particularly preferably comprises the structural units of the Formulae (a)-1, (a)-2 and (a)-3 in which, based on the total weight of the structural units (a)-1, (a)-2 and (a)-3, the total amount of the structural units (a)-1 and (a)-3 is 60 to 95% by weight and the amount of the structural unit (a)-2 is 5 to 40% by weight, and it also particularly preferably comprises the structural units of the formulae (a)-1, (a)-3 and (a)-5 in which, based on the total weight of the structural units (a)-1, (a)-3 and (a)-5, the total amount of the structural units (a)-1 and (a)-3 is 60 to 95% by weight and the amount of the structural unit (a)-5 is 5 to 40% by weight.

Further, the alkali-soluble resin having no epoxy group (a2) preferably comprises the structural units of the formulae (a)-1 and (a)-3 and a structural unit of the formula (a)-6,

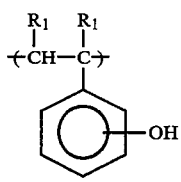

(a)-6 wherein $R_1$ is as defined above, in which, based on the total weight of the structural units (a)-1, (a)-3 and (a)-6, the total amount of the structural units (a)-1 and (a)-3 is 0 to 40% by weight and the amount of the structural unit (a)-6 is 60 to 100% by weight.

The above resin containing the structural unit (a)-6 can be produced by any of a direct polymerization method in which hydroxystyrene or its derivative giving the structural unit (a)-6 and other monomer are polymerized and an indirect polymerization method in which a compound having a protected hydroxyl group and other monomer are polymerized and then the resulting polymer is converted to a hydroxyl group by a proper method such as hydrolysis.

The compound having a protected hydroxyl group can be advantageously selected from benzyloxystyrene, tert-butoxycarbonyloxystyrene, tert-butoxystyrene, tert-butyldimethylsiloxystyrene and acetoxystyrene. It is preferred that in the structural unit (a)-6, the hydroxyl group is at the p-position.

In the indirect polymerization method, a radical-polymerization initiator and an anionic polymerization initiator can be used as a polymerization initiator.

The proportion of the hydroxystyrene or its derivative giving the structural unit (a)-6 for the production of the copolymer is preferably 60 to 100% by weight, particularly preferably 85 to 100% by weight. When this proportion is less than 60% by weight, it is difficult to dissolve the resultant copolymer in an alkaline aqueous solution and the resin is liable to remain after the development. It is therefore difficult to produce a satisfactory pattern.

The alkali-soluble resin having no epoxy resin (a2) is also preferably a nuclear-bromination product of a homopolymer of the structural unit of the above formula (a)-6, or a nuclear-bromination product comprising the structural unit of the above formula (a)-6 and a structural unit of the formula (a)-7,

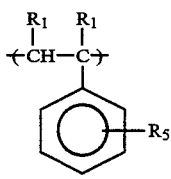

(a)-7 wherein $R_1$ is as defined above, and $R_5$ is a hydrogen atom, a methyl group or a methoxy group,
in which, based on the total weight of the structural units (a)-6 and (a)-7, the amount of the structural unit (a)-6 is at least 60% by weight.

The use of the above nuclear-bromination product exhibits a particularly excellent advantage when the composition of the present invention is used as a material for forming a microfocusing lens. That is, there can be provided a microfocusing lens which satisfies the various properties required of a microfocusing lens and at the same time has a high refractive index necessary for more improvement of the light-gathering ratio.

The above nuclear-bromination product can be produced by the bromination of a homopolymer comprising the structural unit (a)-6 or a copolymer comprising the structural units (a)-6 and (a)-7, or by a direct or indirect polymerization method using a corresponding monomer which is preliminarily brominated. For example, the above copolymer is brominated by dissolving the copolymer in carbon tetrachloride and adding dropwise bromine with taking care that the reaction temperature should not exceed 30° C.

The epoxy compound (d) reacts with the carboxyl group of an indenecarboxylic acid generated from 1,2-naphtoquinonediazide sulfonic acid under the irradiation with radiation thereby to give an overcoat, etc., having excellent heat resistance and solvent resistance.

As the epoxy compound (d), preferred are compounds having at least two epoxy groups in the molecule.

The epoxy compound (d) is preferably selected from a bisphenol A type epoxy resin, a bisphenol F type epoxy resin, a phenol novolak type epoxy resin, a cresol novolak type epoxy resin, an alicyclic epoxy resin, a glycidyl ester-containing epoxy resin, a glycidylamine-containing epoxy resin, and a heterocyclic epoxy resin.

The bisphenol A type epoxy resin is commercially available, for example, in the trade names of Epikote 828, 1001, 1002, 1003, 1004, 1007, 1009 and 1010 (supplied by Yuka Shell Epoxy Kabushiki Kaisha). The bisphenol F type epoxy resin is commercially available, for example, in the trade names of Epikote 807 (supplied by Yuka Shell Epoxy Kabushiki Kaisha). The phenol novolak type epoxy resin is commercially available, for example, in the trade names of Epikote 152 and 154 (supplied by Yuka Shell Epoxy Kabushiki Kaisha) and EPPN-201 and 202 (Nippon Kayaku Co., Ltd). The cresol novolak type epoxy resin is commercially available, for example, in the names of EOCN-102S, 103S, 104S, 1020, 1025 and 1027 (supplied by Nippon Kayaku Co., Ltd) and Epikote 180S75 (supplied by Yuka Shell Epoxy Kabushiki Kaisha). The alicyclic epoxy resin is commercially available, for example, in the names of CY-175, 177 and 179 (supplied by Ciba Geigy) and ERL-4234, 4299, 4221 and 4206 (supplied by U. C. C.). The glycidyl ester-containing epoxy resin is commercially available, for example, in the names of Araldite CY-182, 192 and 184 (Ciba Geigy), Epiclon 200 and 400 (supplied by Dainippon ink and Chemicals, Inc.), Epikote 871 and 872 (Yuka Shell Epoxy Kabushiki Kaisha) and ED-5661 and 5662 (Celanese Coating). The glycidylamine-containing epoxy resin is commercially available, for example, as tetraglycidyldiaminophenylmethane, triglycidyl-p-aminophenol, triglycidyl-m-aminophenol, diglycidylaniline, diglycidyltoluidine, tetraglycidyl-m-xylenediamine, diglycidyltribromonaniline and tetraglycidylbisaminomethylcyclohexane. The heterocyclic epoxy resin is commercially available, for example, in the trade names of Araldite PT810 (supplied by Ciba-Geigy), Epikote RXE-15 (supplied by Yuka Shell Epoxy Kabushiki Kaisha) and EPITEC (supplied by Nissan Chemical Industries Ltd.).

Most of the above-described epoxy compounds are compounds having a high molecular weight, while the epoxy compound used in the present invention shall not be limited by the molecular weight. For example, compounds having a low molecular weight, such as diglycidyl ether of bisphenol A or bisphenol F may be used.

The amount of the epoxy compound for use per 100 parts by weight of the alkali-soluble resin is preferably 5 to 100 parts by weight, more preferably 10 to 50 parts by weight. When this amount is less than 5 parts by weight, the amount of the carboxyl group of an indenecarboxylic acid generated under the irradiation of the radiation-sensitive acid-forming compound with radiation does not sufficiently give reaction between the carbonyl group and the epoxy compound. As a result, the resultant composition shows insufficient heat resistance and insufficient solvent resistance. When the above amount exceeds 100 parts by weight, the compatibility with the base polymer is poor and a coating formed from the composition sometimes has a rough surface.

When the composition of the present invention is used as a lens-forming, radiation-sensitive resin composition, the heating conditions (temperature and time) for the formation of a lens can be advantageously freely set depending upon the kind and amount of the epoxy compound used.

The above composition containing the epoxy compound (d) further contains 1,2-naphthoquinonediazide sulfonic acid ester and a solvent.

The 1,2-naphtoquinonediazide sulfonic acid ester is selected from those described above, and used in the same amount as that described above.

The resin composition of the present invention (including the resin composition containing no epoxy compound (d) and the resin composition containing the epoxy compound (d)) may contain the following additives as required.

Curing Catalyst

In the present invention, the carboxyl group of indenecarboxylic acid generated after the irradiation of the radiation-sensitive acid-forming compound with radiation is allowed to react with the epoxy compound under heat to improve the heat resistance and solvent resistance. It is effective to jointly use a catalyst for the promotion of the reaction. The curing catalyst may be selected from amine and acid anhydride which are known as a curing agent for an epoxy compound. In view of the storage stability of a solution, a latent curing agent is preferred. The latent curing catalyst includes dicyandiamide, organic acid dihydrazide, amineimide, tertiary amine salt, 1-substituted imidazole, imidazole salt, Lewis acid and Bronsted acid which are all activated by heating, and also includes aromatic diazonium salt of Brosted salt, aromatic sulfonium salt and an iron aromatic compound of Brosted salt which are all activated by irradiation with radiation.

The amount of the curing catalyst for use per 100 parts by weight of the epoxy compound (d) and the alkali-soluble resin (a) in total is 0.01 to 10 parts by weight, preferably 0.1 to 5 parts by weight. When this amount is less than 0.01 part by weight, the curing catalyst does not exhibit its effect as required, and no sufficient effect on the heat resistance and solvent resistance is produced. When the above amount exceeds 10 parts by weight, the storage stability of the solution may decrease.

The curing catalyst may contain a promoter such as acid anhydride in combination.

(Meth)acrylic Compound

When the composition of the present invention is heat-treated after the irradiation with radiation, a (meth)acrylic compound itself is polymerized thereby to impart much improved heat resistance and solvent resistance to the resultant overcoat, etc.

The (meth)acrylic compound includes monofunctional methacrylate, difunctional methacrylate and trifunctional(meth)acrylate or (meth)acrylate having more than 3 functional groups.

The monofunctional (meth)acrylate is commercially available, for example, in the trade names of Aronix M-101, 111 and 114 (supplied by Toagosei Chemical Industry Co., Inc.), KAYARAD TC-110S and TC-120S (supplied by Nippon Kayaku Co., Ltd), and V158 and V2311 (supplied by Osaka Yuki Kagaku Kogyo K.K.). The difunctional (meth)acrylate is commercially available, for example, in the trade names of Aronix M-210, M-240 and M-6200 (supplied by Toagosei Chemical Industry Co., Ltd.), KAYARAD HDDA, HX-220 and R-604 (supplied by Nippon Kayaku Co., Ltd), and V260, V312 and V335HP (supplied by Osaka Yuki Kagaku Kogyo K.K.). The trifunctional (meth)acrylate or (meth)acrylate having more than 3 functional groups is commercially available, for example, in the trade names of Aronix M-400, M-405, M-450, M-7100, M-8030 and M-806 (supplied by Toagosei Chemical Industry Co., Ltd.), KAYARAD TMPTA, DPCA-20, -30, -60 and -120 (supplied by Nippon Kayaku Co., Ltd) and VGPT (supplied by Osaka Yuki Kagaku Kogyo K.K.).

The amount of the (meth)acrylic compound for use per 100 parts by weight of the alkali-soluble resin (a) is preferably 5 to 100 parts by weight, particularly preferably 10 to 30 parts by weight. When this amount is less than 5 parts by weight, no sufficient reaction takes place during the heat treatment, and the effect on the heat resistance and solvent resistance is not produced as expected. When the above amount exceeds 100 parts by weight, the compatibility to the alkali-soluble resin (a) is poor, and a formed film sometimes has a rough surface.

Surfactant

The composition of the present invention may further contain a surfactant. The surfactant is selected from commercially available, fluorine-containing surfactants such as BM-1000 and BM-1100 (supplied by BM Chemie), Megafac F142D, F172, F173 and F183 (supplied by Dainippon Ink and Chemicals, Inc.), Fluorad FC-135, FC-170C, FC-430 and FC-431 (supplied by Sumitomo 3M Co., Ltd), and Surflon S-112, S-113, S-131, S-141 and S-145 (supplied by Asahi Glass Co., Ltd.). The amount of the surfactant for use per 100 parts by weight of the alkali-soluble resin is preferably 0.005 to 5 parts by weight, more preferably 0.01 to 2 parts by weight.

Preparation of Radiation-Sensitive Resin Composition

The composition off the present invention can be easily produced by uniformly mixing the above-specified components in the presence of a proper solvent (c). In the mixing, the components are generally dissolved in a suitable solvent (c) and used in a form of solution. At this time, the mixture is prepared to have a solid content of 10 to 50% by weight, preferably 20 to 40%. The solvent (c) is selected from those which permits uniformly mixing the components and do not react with any component.

The solvent (c) includes alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol alkyl ether acetates such as propylene glycol methyl ether acetate and propylene glycol propyl ether acetate; aromatic hydrocarbons such as toluene and xylene; ketones such as methyl ethyl ketone, cyclohexanone and 4-hydroxy-4-methyl-2-pentanone, and esters such as ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate and butyl acetate.

Further, a high-boiling solvent may be used in combination. The high-boiling solvent includes N-methylformamide, N,N-dimethylformamide, N-methylformamilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxlate, diethyl maleate, γ-butyrolactone, ethylene carbonate, propylene carbonate and phenyl cellosolve acetate.

In view of solubility, reactivity with each component and easiness to form a film, preferred among these solvents are glycol ethers such as ethylene glycol monoethyl ether; ethylene glycol alkyl ether acetates such as ethyl cellosolve acetate; esters such as ethyl 2-hydroxypropionate; and diethylene glycols such as diethylene glycol monomethyl ether.

A composition solution may be also prepared as follows. For example, a solution of the alkali-soluble resin, a solution of the radiation-sensitive acid-forming compound, a solution of the curing component and a solution of other components are separately prepared, and predetermined proportions of these solutions are mixed just before use.

The so-prepared composition solution may be filtered through a millipore filter having an opening diameter of 0.2 μm before use.

Method of Forming a Film

In the present invention, the above composition solution is applied to the surface of a predetermined substrate, and the solvent is removed by heating, whereby an intended film can be formed.

The method of applying the composition solution to the substrate surface is not specially limited, and there may be employed various methods such as a spray method, a roll coat method and a spin coat method.

Although differing depending upon the kinds and amounts of the components for the composition, the heating conditions are generally set at 70° to 90° C. for 5 to 15 minutes. Then, the thus-obtained film is irradiated, for example, with ultraviolet light through a mask of a predetermined pattern, the pattern is developed with a developing liquid, and an unnecessary portion is removed to form a pattern. The developing liquid used in the present invention is selected from aqueous solutions of alkalis such as sodium hydroxide, potassium hydroxide, sodium carbonate, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammoniumhydroxide, tetraethylammoniumhydroxide, pyrrole, piperidine, 1,8-diazabicyclo(5.4.0)-7-undecene and 1,5-diazabicyclo(4.3.0)-5-nonane. The developing liquid may further contain a proper amount of water-soluble organic solvents such as methanol and ethanol or a surfactant.

The development time is generally 30 to 180 seconds. The development is carried out by any one of a puddle method and a dipping method. After the development, the substrate is washed with ultra-pure water for 30 to 90 seconds and air-dried with compressed air or compressed nitrogen to remove an unnecessary portion and form a pattern. Then, the pattern which is a non-irradiated portion is irradiated, for example, with ultraviolet light to convert an acid-forming compound remaining in the pattern to an acid. Further, the substrate is heat-treated by means of a heating apparatus such as a hot plate or an oven at a predetermined temperature, e.g., between 150° C. and 250° C., for a predetermined period of time, e.g., for 5 to 30 minutes on a hot plate or for 30 to 90 minutes in an oven, whereby there can be obtained an overcoat excellent in heat resistance, transparency and hardness.

By the above method of forming a film, the resin composition of the present invention can be formed into a coating used in an optical device or can be used to form a lens, particularly a microfocusing lens array.

The present invention will be described more specifically hereinafter by reference to Examples. However, the present invention shall not be limited by the Examples.

In Examples, "%" stands for "% by weight" unless otherwise specified.

SYNTHESIS EXAMPLE 1

A flask was flushed with nitrogen and then charged with 459.0 g of a solution of 9.0 g of 2,2'-azobisisobutyronitrile in a diethylene glycol dimethyl ether. Thereafter, the flask was further charged with 22.5 g of styrene, 45.0 g of methacrylic acid, 67.5 g of dicyclopentanyl methacrylate and 90.0 g of glycidyl methacrylate, and then, the stirring of the mixture was moderately started. The temperature of the solution was increased to 80° C., and after this temperature was maintained for 5 hours, the solution was heated at 90° C. for 1 hour. And, the polymerization was terminated.

Then, the reaction mixture was added dropwise to a large amount of water to coagulate a reaction product.

The resultant coagulation product was redissolved in 200 g of tetrahydrofuran, and then coagulated with a large amount of water.

The above redissolution-coagulation procedures were repeated three times, and the resultant coagulation product was vacuum-dried at 60° C. for 48 hours to give an intended copolymer. Then, the copolymer was dissolved in diethylene glycol so as to form a copolymer solution having a solid content of 25% by weight.

SYNTHESIS EXAMPLE 2

A flask was flushed with nitrogen and then charged with 459.0 g of a solution of 9.0 g of 2,2'-azobis-(2,4-dimethylvaleronitrile) in diethylene glycol dimethyl ether.

Thereafter, the flask was charged with 45.0 g of methacrylic acid, 90.0 g of dicyclopentanyl methacrylate and 90.0 g of glycidyl methacrylate, and the stirring of the resultant mixture was moderately started. The temperature of the solution was increased up to 80° C., and after this temperature was maintained for 5 hours, the solution was heated at 90° C. for 1 hour. And, the polymerization was terminated.

The reaction mixture was treated in the same manner as in Synthesis Example 1 to give a copolymer solution.

SYNTHESIS EXAMPLE 3

A flask was flushed with nitrogen and then charged with 459.0 g of a solution of 9.0 g of 2,2'-azobisisobutyronitrile in diethylene glycol dimethyl ether. Thereafter, the flask was charged with 56.2 g of methacrylic acid, 101.25 g of sec-butyl methacrylate and 67.5 g of glycidyl methacrylate, and the stirring of the mixture was moderately started. The temperature of the solution was increased up to 80° C., and after this temperature was maintained for 5 hours, the solution was heated at 90° C. for 1 hour. And, the polymerization was terminated. Then, the reaction mixture was treated in the same manner as in Example 1 to give a copolymer solution.

SYNTHESIS EXAMPLE 4

A flask was flushed with nitrogen and then charged with 459.0 g of a solution of 9.0 g of 2,2'-azobisisobutyronitrile in methyl 3-methoxypropionate.

Thereafter, the flask was charged with 56.25 g of methacrylic acid, 90.0 g of methyl methacrylate and 78.75 g of 3,4-epoxybutyl methacrylate, and the stirring of the mixture was moderately started. The polymerization was started at 80° C., and after this temperature was maintained for 5 hours, the solution was heated at 90° C. for 1 hour. And, the polymerization was terminated.

Then, the reaction mixture was treated in the same manner as in Synthesis Example 1 to give a copolymer solution.

SYNTHESIS EXAMPLE 5

A flask was flushed with nitrogen and then charged with 459.0 g of a solution of 9.0 g of 2,2'-azobisisobutyronitrile in diethylene glycol dimethyl ether.

Thereafter, the flask was charged with 45.0 g of maleic anhydride, 112.5 g of benzyl methacrylate and 67.5 g of N-[4-(2,3-epoxypropoxy)-3,5-dimethylphenylpropyl]acrylamide, and then the stirring of the resultant mixture was moderately started. The polymerization was started at 80° C., and after this temperature was maintained for 5 hours, the solution was heated at 90° C. for 1 hour. And the polymerization was terminated.

Then, the reaction mixture was treated in the same manner as in Synthesis Example 1 to give a copolymer solution.

SYNTHESIS EXAMPLE 6

A flask was flushed with nitrogen, and then charged with 459.0 g of a solution of 9.0 g of 2,2'-azobis-(2,4-dimethylvaleronitrile) in methylcellosolve acetate.

Thereafter, the flask was charged with 45.0 g of acrylic acid, 90.0 g of dicyclopentanyl methacrylate and 90.0 g of α-methylstyrene, and the stirring of the mixture was started moderately. The temperature of the solution was increased up to 80° C., and after this temperature was maintained for 4 hours, the temperature of the reaction mixture was gradually decreased to room temperature to terminate the polymerization.

Then, the reaction mixture was treated in the same manner as in Synthesis Example 1 to give a copolymer solution.

SYNTHESIS EXAMPLE 7

A flask was flushed with nitrogen, and then charged with 461.05 g or a solution of 11.05 g of 2,2'-azobisisobutyronitrile in dioxane. Thereafter, the flask was charged with 90.0 g of styrene, 45.0 g of maleic anhydride and 90.0 g of 2-hydroxypropyl methacrylate, and then the stirring of the solution was moderately started. The temperature of the solution was increased up to 60° C., and after this temperature was maintained for 5 hours, the temperature was gradually decreased to room temperature to terminate the polymerization. Then, the reaction product solution was added dropwise to an n-hexane/isopropyl alcohol mixed solution to coagulate the reaction product.

The coagulation product was washed with water, redissolved in 200 g or dioxane, and recoagulated with a large amount of n-hexane/isopropyl alcohol mixed solution.

The above redissolution-coagulation procedures were repeated three times, and the resultant coagulation product was vacuum-dried at 60° C. for 48 hours to give an intended copolymer. Then, the copolymer was dissolved in diethylene glycol so as to form a copolymer solution having a solid content of 25% by weight.

SYNTHESIS EXAMPLE 8

A flask was flushed with nitrogen, and then charged with 455.0 g of a solution of 5.0 g of 2,2'-azobisisobutyronitrile in diethylene glycol dimethyl ether. Thereafter, the flask was charged with 37.5 g of styrene, 75.0 g of methyl methacrylate and 37.5 g of methacrylic acid, and the stirring of the solution was moderately started. The polymerization was started at 80° C., and after this temperature was maintained for 8 hours, the solution was heated at 90° C. for 1 hour. Then, the polymerization was terminated.

Thereafter, the reaction product solution was added dropwise to a large amount of water to coagulate the reaction product.

The resultant coagulation product was washed with water, then redissolved in 200 g of tetrahydrofuran, and recoagulated with a large amount of water.

The above redissolution-coagulation procedures were repeated three times, and the resultant coagulation product was vacuum-dried at 60° C. for 48 hours to give an intended copolymer. Then, the copolymer was dissolved in diethylene glycol so as to form a copolymer solution having a solid content of 25% by weight.

SYNTHESIS EXAMPLE 9

A flask was flushed with nitrogen, and then charged with 500 g of a solution of 10 g of 2,2'-azobisisobutyronitrile in dioxane. Thereafter, the flask was charged with 50 g of styrene and 450 g of p-tert-butoxystyrene, and then, the stirring of the solution was moderately started. The polymerization was started at 70° C., and after this temperature was maintained for 12 hours, the temperature was decreased to room temperature. Then, acetone was added so as to form a solution having a concentration of 15% by weight, and the solution was added dropwise in a 10-fold amount of methanol to coagulate the reaction product. The resultant coagulation product was washed with methanol, redissolved in 500 g of dioxane, and recoagulated with a large amount of methanol. The above redissolution-coagulation procedures were repeated three times, and the resultant coagulation product was vacuum-dried at 60° C. for 48 hours to give an intended copolymer.

200 Grams of the above-obtained copolymer was placed in a flask, and 1,133 g of dioxane was added to form a solution having a copolymer content of 15% by weight. Then, the flask was placed in an oil bath at 120° C., and the solution was refluxed at a boiling point while it was stirred under nitrogen bubbling. 200 Grams of a 7.2% hydrochloric acid aqueous solution was slowly added with a dropping funnel over 60 minutes with taking care not to form a precipitate of a polymer, and the refluxing was further continued for 5 hours.

After the completion of hydrolysis was confirmed by infrared spectrum (IR), the solution was gradually temperature-decreased to room temperature, diluted with acetone, and added dropwise to a 10-fold amount of water to coagulate the reaction product. The coagulation mixture was filtered and fully washed with ultra-pure water until the filtrate became neutral to give a white polymer. The white polymer was dried at 60° C. for 48 hours to give an intended copolymer.

SYNTHESIS EXAMPLE 10

(1) A flask was flushed with nitrogen, and charged with 500 g of a solution of 10 g of 2,2'-azobisisobutyronitrile in dioxane. Thereafter, the flask was charged with 50 g of styrene and 450 g of p-tert-butoxystyrene, and the stirring of the mixture was moderately started. The polymerization was started at 70° C., and after this temperature was maintained for 12 hours, the solution was gradually temperature-decreased to room temperature. Then, acetone was added to form a solution having a concentration of 15% by weight, and the solution was added dropwise to a 10-fold amount of methanol to coagulate the reaction product. This coagulation product was fully washed with methanol, redissolved in 500 g of dioxane, and recoagulated with a large amount of methanol.

The above redissolution-coagulation procedures were repeated three times, and the resultant coagulation product was vacuum-dried at 60° C. for 48 hours to give an intended copolymer.

Thereafter, 200 g of the above-obtained copolymer was placed in a flask, and 1,133 g of dioxane was added to form a solution having a copolymer content of 15% by weight. Then, the flask was placed in an oil bath at 120° C., and the solution was refluxed at a boiling point while it was stirred under nitrogen bubbling. 200 Grams of a 7.2% hydrochloric acid aqueous solution was slowly added with a dropping funnel over 60 minutes with taking care not to form a precipitate of a polymer, and the refluxing was further continued for 5 hours.

After the completion of hydrolysis was confirmed by infrared spectrum (IR), the solution was gradually temperature-decreased to room temperature, diluted with acetone, and added dropwise to a 10-fold amount of ultra-pure water to coagulate the reaction product. The coagulation mixture was filtered to remove the coagulator, and the fully washed with ultra-pure water until the filtrate became neutral to give a white polymer. The so-obtained white polymer was dried at 60° C. for 48 hours to give an intended alkali-soluble polymer.

(2) 100 Grams of the alkali-soluble polymer obtained in the above (1) was dissolved in 400 g of carbon tetrachloride in a flask which had been flushed with nitrogen, and 50 g of bromine was added dropwise with a dropping funnel with taking care that the reaction temperature should not exceed 30° C. Then, the mixture was continuously stirred for 3 hours. The resultant precipitate was separated by filtration, and was dissolved in 400 g of acetone. The resultant mixture was gradually added to a 10-fold amount of ultra-pure water to precipitate a polymer. The reaction mixture was filtered and washed with water, and the resultant solid was redissolved in acetone. The resultant solution was added to 10 lit. of a 4% $NaHCO_3$ aqueous solution to precipitate a polymer. The solution was filtered, and then the polymer was fully washed with water to completely remove $NaHCO_3$ and vacuum-dried at 40° C. for 24 hours.

SYNTHESIS EXAMPLE 11

Example 10 (1) was repeated except that the p-tert-butoxystyrene was replaced with p-acetoxystyrene to give an alkali-soluble polymer.

Example 10 (2) was repeated except that the alkali-soluble polymer used in Example 10 (2) was replaced with the above-obtained alkali-soluble polymer to give a brominated alkali-soluble polymer.

SYNTHESIS EXAMPLE 12

Example 10 (1) was repeated except that the p-tert-butoxystyrene was replaced with p-tert-butyldimethylsiloxystyrene to give an alkali-soluble polymer.

Example 10 (2) was repeated except that the alkali-soluble polymer used in Example 10 (2) was replaced with the above-obtained alkali-soluble polymer to give a brominated alkali-soluble polymer.

Example 1

(1) Preparation of radiation-sensitive solution

100 Grams of the copolymer solution (copolymer 25 g) obtained in Synthesis Example 1 was diluted with 13.64 g of diethylene glycol dimethyl ether, and then 10.0 g of 1,2-naphthoquinonediazide-5-sulfonic acid ester of 4,4'-[1-[4-(1-(4-hydroxyphenyl)-1-methylethyl)-phenyl]ethylidene]diphenol (average esterification ratio 66.7 mol %) was dissolved. The resultant solution was filtered through a millipore filter having a pore size of 0.22 $\mu$m to give a radiation-sensitive solution (1).

(2) Formation of film

A wafer having a silicon oxide film treated with hexamethyldisilazane was coated with the above radiation-sensitive solution (1) with a spinner, and the resultant coating was prebaked in an oven at 80° C. for 10 minutes to give a resist film having a thickness of 2.0 $\mu$m.

(3) Patterning

A predetermined pattern mask was tightly placed on the resist film obtained in the above (2), and the resist film was irradiated with ultraviolet light having a light intensity of 10 $mJ/cm^2$ at 365 nm for 30 seconds. Then, the resist film was developed with an aqueous solution containing 0.12% by weight of tetramethylammonium hydroxide at 25° C. for 2 minutes, and rinsed with ultra-pure water for 1 minute. By this procedure, unnecessary portions were removed, and a 20 $\mu$m $\times$ 20 $\mu$m pattern was resolved.

(4) Curing of film

The entire surface of the film obtained in the above (3) was light-exposed for 30 seconds with the same exposure apparatus as that used in the above (3), and then the film was heated in a clean oven at 200° C. for 1 hour to cure the film and form an overcoat having necessary characteristics.

(5) Evaluation on transparency

A film was formed in the same manner as in the above (2) except that the wafer having a silicon oxide film was replaced with a transparent substrate (Corning 7059: supplied by Corning). Then, the film was subjected to development using a tetramethylammonium hydroxide aqueous solution, and rinsed with ultra-pure water for 1 minute. The entire surface of the film was light-exposed for 30 seconds, and heated in a clean oven at 200° C. for 1 hour. The resultant substrate was measured for transmissivity at 400 to 800 nm with a spectrophotometer (150-20 model double beam; supplied by Hitachi Limited). In this measurement, the minimum transmissivity exceeding 95% was taken as O, that between 90% and 95% was taken as Δ, and that of less than 90% was taken as X. Table 1 shows the result.

(6) Evaluation on heat resistance

The substrate on which the pattern was formed in the above (3) was heated in a clean oven at 250° C. for 1 hour, and then measured for a film thickness. And, a normalized thickness ratio was calculated based on the thickness of the film formed on the substrate in the above (3). The normalized thickness ratio exceeding 95% was taken as O, the ratio between 90% and 95% was taken as Δ, and the ratio of less than 90% was taken as X. Table 1 shows the result.

(7) Evaluation on heat discoloration resistance

The substrate on which the pattern was formed in the above (4) was heated in a clean oven at 250° C. for 1 hour, and measured for a transmissivity with a spectrophotometer in the same manner as in the above (5), and a change rate in the transmissivity was determined. The change rate of less than 5% was taken as O, the rate between 5% and 10% was taken as Δ, and the rate exceeding 10% was taken as X. Table 1 shows the result.

(8) Measurement of hardness

The substrate prepared in the above (4) was measured for a surface hardness by a pencil scratch test according to JIS K-5400-1990, 8.4.1, and the scratch on the film was evaluated according to a pencil hardness. Table 1 shows the result.

Example 2

A composition solution was prepared in the same manner as in Example 1 except that the copolymer solution obtained in Synthesis Example 1 was replaced with the copolymer solution obtained in Synthesis Example 2, and evaluated to show that a 20 μm×20 μm space was resolved when the resist film was developed with an aqueous solution containing 0.20% of tetramethylammonium hydroxide. Table 1 shows the other evaluation results.

Example 3

A composition solution was prepared in the same manner as in Example 1 except that the copolymer solution obtained in Synthesis Example 1 was replaced with the copolymer solution obtained in Synthesis Example 3, and evaluated in the same manner as in Example 1 to show that a 20 μm×20 μm space was resolved when the resist film was developed with an aqueous solution containing 0.16% of tetramethylammonium hydroxide. Table 1 shows the other evaluation results.

Example 4

A composition selection was prepared in the same manner as in Example 1 except that the copolymer solution obtained in Synthesis Example 1 was replaced with the copolymer solution obtained in Synthesis Example 4, and evaluated in the same manner as in Example 1 to show that a 20 μm×20 μm space was resolved when the resist film was developed with an aqueous solution containing 0.14% of tetramethylammonium hydroxide. Table 1 shows the other evaluation results.

Example 5

A composition solution was prepared in the same manner as in Example 1 except that the 1,2-naphthoquinonediazide-5-sulfonic acid ester of 4,4'-[1-[4-(1-(4-hydroxyphenyl)- 1-methylethyl)phenyl]ethylidene]-diphenol (average esterification ratio 66.7 mol %) was replaced with 7.5 g of 1,2-naphthoquinonediazide-5-sulfonic acid ester of 2,3,4,4'-tetrahydroxybenzophenone (average esterification ratio 75 mol %), and evaluated in the same manner as in Example 1 to show that a 20 μm×20 μm space was resolved when the resist film was developed with an aqueous solution containing 0.14% of tetramethylammonium hydroxide. Table 1 shows the other evaluation results.

Example 6

A composition solution was prepared in the same manner as in Example 1 except that the copolymer solution obtained in Synthesis Example 1 was replaced with the copolymer solution obtained in Synthesis Example 5, and evaluated in the same manner as in Example 1 to show that a 20 μm×20 μm space was resolved when the resist film was developed with an aqueous solution containing 1.0% of tetramethylammonium hydroxide. Table 1 shows the other evaluation results.

TABLE 1

| Example | Developing solution concentration (%) | Hard-[1] ness (—) | Trans-[2] parency (—) | Heat[2] resistance (—) | Heat dis-[2] coloration resistance (—) |
|---|---|---|---|---|---|
| 1 | 0.12 | 3H | O | O | Δ |
| 2 | 0.20 | 2H | O | Δ | O |
| 3 | 0.16 | 3H | O | O | O |
| 4 | 0.14 | 4H | O | O | O |
| 5 | 0.14 | 3H | O | O | O |
| 6 | 1.0 | 3H | O | O | O |

[1] 200° C./hr. measured after heated
[2] 250° C./hr. measured after additionally heated Examples 7–12

Composition solutions were prepared in the same manner as in Examples 1 to 6 except that 5.0 g of a polyfunctional acrylate, Aronix M-400 (supplied by Toagosel Chemical Industry Co., Ltd.) was additionally used as an additive, and evaluated. Table 2 shows the results.

TABLE 2

| Example | Developing solution concentration (%) | Hard-[1] ness (—) | Trans-[2] parency (—) | Heat[2] resistance (—) | Heat dis-[2] coloration resistance (—) |
|---|---|---|---|---|---|
| 7 | 0.10 | 4H | O | O | O |
| 8 | 0.20 | 3H | O | O | O |
| 9 | 0.14 | 4H | O | O | O |
| 10 | 0.14 | 4H | O | O | O |
| 11 | 0.14 | 4H | O | O | O |
| 12 | 1.0 | 4H | O | O | O |

[1],[2] Meaning as indicated in Table 1.

Examples 13-18

Composition solutions were prepared in time same manner as in Examples 1 to 6 except that 5.0 g of a cresol novolak type epoxy resin, EOCN-1020 (supplied by Nippon Kayaku Co., Ltd) was additionally used as an additive, and evaluated. Table 3 shows the results.

TABLE 3

| Example | Developing solution concentration (%) | Hard-[1] ness (—) | Trans-[2] parency (—) | Heat[2] resistance (—) | Heat dis-[2] coloration resistance (—) |
|---|---|---|---|---|---|
| 13 | 0.14 | 3H | ○ | ○ | ○ |
| 14 | 0.22 | 3H | ○ | ○ | ○ |
| 15 | 0.18 | 3H | ○ | ○ | ○ |
| 16 | 0.16 | 2H | ○ | ○ | ○ |
| 17 | 0.14 | 4H | ○ | ○ | ○ |
| 18 | 1.0 | 4H | ○ | ○ | ○ |

[1],[2]Meaning as indicated in Table 1.

Example 19

(1) Preparation of radiation-sensitive solution

100 Grams of the copolymer solution obtained in Synthesis Example 6 (copolymer 25 g) was diluted with 13.64 g of diethylene glycol dimethyl ether, and then 10.0 g of 1,2-naphthoquinonediazide-5-sulfonic acid ester of 1,1,3-tris(2,5-dimethyl-4-hydroxyphenyl)-3-phenylpropane (average esterification ratio 63.3 mol %) and 2.5 g of an o-cresol novolak type resin, EOCN-1020 (supplied by Nippon Kayaku Co., Ltd) were dissolved. The resultant solution was filtered with a millipore filter having a pore size of 0.22 μm to give a radiation-sensitive solution.

(2) Formation of film

A variety of Optmer SS's (supplied by Japan Synthetic Rubber Co., Ltd) were formed on a silicon wafer, and then the radiation-sensitive solution obtained in the above (1) was spin-coated thereon. The resultant coating was prebaked on a hot plate at 70° C. for 3 minutes to give a resist film having a thickness of 2.8 μm.

(3) Preparation of microfocusing lens

A predetermined pattern mask was tightly placed on the resist film obtained in the above (2), and the resist film was irradiated with ultraviolet light having a light intensity of 10 mJ/cm² at 365 nm for 30 seconds. Then, the pattern was developed with an aqueous solution containing 0.12% of tetramethylammonium hydroxide at 25° C. for 2 minutes, and rinsed with ultra-pure water for 1 minute. A space having a width of 0.8 μm was resolved. Then the entire surface of the resist film was light-exposed with the same exposure apparatus for 50 seconds, and heated on a hot plate at a lens-formable temperature shown in Table 4 for 5 minutes to give a microfocusing lens having a width of 5.0 μm. This lens was evaluated on heat deformation resistance, and Table 4 shows the result (The same evaluation was also conducted in Examples 20 to 54 to follow).

The heat deformation resistance was evaluated as follows.

When the above-obtained microfocusing lens was heated at 170° C. for 3 hours, the space width exceeding 80% of the width before heating was taken as O, the width of 50 to 80% was taken as Δ, and the width of less than 50% was taken as X.

(4) Evaluation on transparency

A resist film was formed in the same manner as in the above (2) except that the wafer having a silicon oxide film treated with hexamethyldisilazane was replaced with a transparent substrate (Corning 7059: supplied by Corning). Then, the film was subjected to development using a tetramethylammonium hydroxide aqueous solution, and rinsed with ultra-pure water for 1 minute. The entire surface of the film was exposed to light for 50 seconds, and a pattern having a width of 5.0 μm was heated on a hot plate at a lens-formable temperature of 150° to 170° C., and further heated at 200° C. for 1 hour. The resultant transparent substrate having a microfocusing lens was measured for transmissivity at 400 to 800 nm with a spectrophotometer (150-20 model double beam; supplied by Hitachi Limited). In this measurement, the minimum transmissivity exceeding 95% was taken as O, that between 90% and 95% was taken as Δ, and that of less than 90% was taken as X. Table 1 shows the result (The same evaluation was also conducted in Examples 20 to 54 to follow).

(5) Evaluation on solvent resistance

The microfocusing lens substrate prepared in the above (3) was immersed in a variety of solvents for 1 minute each and rinsed with ultra-pure water to evaluate the solvent resistance. Table 4 shows the result (the same evaluation was conducted in Examples 20 to 54 to follow). The solvent to which the microfocusing lens substrate showed poor resistance is also shown as the following abbreviations (A=acetone, T=2.4% tetramethylammonium hydroxide aqueous solution, E=ethyl cellosolve acetate, I=isopropyl alcohol, M=methyl cellosolve).

Example 20

A radiation-sensitive solution was prepared and evaluated in the same manner as in Example 19 except that the copolymer solution obtained in Synthesis Example 6 was replaced with the copolymer solution obtained in Synthesis Example 7, and evaluated to show that a space having a width of 0.8 μm was resolved when the resist film was developed with an aqueous solution containing 0.40% of tetramethylammonium hydroxide. A microfocusing lens was also similarly produced under heat at a temperature of 150° to 160° C. Table 4 shows the results.

Example 21

A radiation-sensitive solution was prepared and evaluated in the same manner as in Example 19 except that the copolymer solution obtained in Synthesis Example 6 was replaced with the copolymer solution obtained in Synthesis Example 8, and evaluated to show that a space having a width of 0.8 μm was resolved when the resist film was developed with an aqueous solution containing 1.0% of tetramethylammonium hydroxide. A microfocusing lens was also similarly produced under heat at a temperature of 130° to 160° C. Table 4 shows the results.

Example 22

A radiation-sensitive solution was prepared and evaluated in the same manner as in Example 19 except that the copolymer solution obtained in Synthesis Example 6 was replaced with 25 g of the copolymer obtained in Synthesis Example 9, and evaluated to show that a space having a width of 0.6 μm was resolved when the resist film was developed with an aqueous solution containing 2.0% of tetramethylammonium hydroxide. A microfocusing lens was also similarly produced under heat at a temperature of 130° to 160° C. Table 4 shows the results.

Example 23

25 Grams of the copolymer obtained in Synthesis Example 9 was dissolved in 75 g of methyl methoxypropionate, and then 10.0 g of 1,2-naphthoquinonediazide-5-sulfonic acid ester of 1,1,3-tris(2,5-dimethyl-4-hydroxyphenyl)-3-phenylpropane (average esterification ratio 63.3 mol %) and 2.5 g of a cresol novolak type epoxy resin, EOCN-1020 (supplied by Nippon Kayaku Co., Ltd) were dissolved. The resultant solution was filtered through a millipore filter having a pore size of 0.22 μm to give a radiation-sensitive solution. Then, this radiation-sensitive solution was evaluated in the same manner as in Example 19 to show that a space having a width of 0.6 μm was resolved when the resist film was developed with an aqueous solution containing 2.0% of tetramethylammonium hydroxide. A microfocusing lens was also similarly produced under heat at a temperature of 130° to 160° C. Table 4 shows the results.

Example 24

A radiation-sensitive solution was prepared in the same manner as in Example 19 except that the 1,2-naphthoquinonediazide-5-sulfonic acid ester of 1,1,3-tris(2,5-dimethyl-4-hydroxyphenyl)-3-phenylpropane (average esterification ratio 63.3 mol %) was replaced with 1,2-naphthoquinonediazide-5-sulfonic acid ester of 4,4'-[1-[4-(1-(4-hydroxyphenyl)-1-methylethyl)phenyl]ethylidene]diphenol (average esterification ratio 66.7 mol %), and the so-obtained radiation-sensitive solution was evaluated in the same manner as in Example 19 to show that a space having a width of 0.8 μm was resolved when the resist film was developed with an aqueous solution containing 2.0% of tetramethylammonium hydroxide. A microfocusing lens was also similarly produced under heat at a temperature of 140° to 160° C. Table 4 shows the results.

Example 25

A radiation-sensitive solution was prepared in the same manner as in Example 19 except that the o-cresol novolak type epoxy resin was replaced with 5.0 g of a bisphenol A type epoxy resin, Epikote 828 (supplied by Yuka Shell Epoxy Kabushiki Kaisha), and the so-obtained radiation-sensitive solution was evaluated in the same manner as in Example 19 to show that a space having a width of 1.2 μm was resolved when the resist film was irradiated with ultraviolet light for 30 seconds and then developed with an aqueous solution containing 0.18% of tetramethylammonium hydroxide. A microfocusing lens was also similarly produced under heat at a temperature of 140° to 160° C. Table 4 shows the results.

Example 26

A radiation-sensitive solution was prepared in the same manner as in Example 19 except that the o-cresol novolak type epoxy resin was replaced with 5.0 g of a bisphenol F type epoxy resin, Epikote 815 (supplied by Yuka Shell Epoxy Kabushiki Kaisha), and the so-obtained radiation-sensitive solution was evaluated in the same manner as in Example 19 to show that a space having a width of 1.0 μm was resolved when the resist film was irradiated with ultraviolet light for 30 seconds and then developed with an aqueous solution containing 0.14% of tetramethylammonium hydroxide. A microfocusing lens was also similarly produced under heat at a temperature of 130° to 140° C. Table 4 shows the results.

Example 27

A radiation-sensitive solution was prepared in the same manner as in Example 19 except that the o-cresol novolak type epoxy resin was replaced with 5.0 g of Araldite CY184 (supplied by Ciba-Geigy), and the so-obtained radiation-sensitive solution was evaluated in the same manner as in Example 19 to show that a space having a width of 1.0 μm was resolved when the resist film was irradiated with ultraviolet light for 30 seconds and then developed with an aqueous solution containing 0.16% of tetramethylammonium hydroxide. A microfocusing lens was also similarly produced under heat at a temperature of 120° to 140° C. Table 4 shows the results.

Example 28

A radiation-sensitive solution was prepared in the same manner as in Example 19 except that the o-cresol novolak type epoxy resin was replaced with 5.0 g of an alicyclic epoxy resin, CY-179 (supplied by Ciba-Geigy), and the so-obtained radiation-sensitive solution was evaluated in the same manner as in Example 19 to show that a space having a width of 0.8 μm was resolved when the resist film was irradiated with ultraviolet light for 30 seconds and then developed with an aqueous solution containing 0.20% of tetramethylammonium hydroxide. A microfocusing lens was also similarly produced under heat at a temperature of 150° to 160° C. Table 4 shows the results.

Examples 29–30

A radiation-sensitive solution was prepared in the same manner as in Example 19 except that the o-cresol novolak type epoxy resin was replaced with 2.5 g of the epoxy resin-containing alkali-soluble resin obtained in Synthetic Examples 1 and 2, and the so-prepared radiation-sensitive solution was evaluated in the same manner as in Example 19. Table 4 shows the results.

TABLE 4

| Example | Exposure time (sec) | Developing solution concentration (%) | Re-[1] solution (μm) | Lens-formable temperature (°C.) | Heat-deformation resistance (—) | Transparency (—) | Solvent resistance (—) |
| --- | --- | --- | --- | --- | --- | --- | --- |
| 19 | 30 | 0.12 | 0.8 | 150–170 | ○ | ○ | X (I) Δ (A) |
| 20 | 30 | 0.40 | 0.8 | 150–160 | ○ | ○ | ○ |
| 21 | 10 | 1.0 | 0.8 | 130–160 | ○ | ○ | Δ (I) |
| 22 | 10 | 2.0 | 0.6 | 130–160 | ○ | ○ | ○ |
| 23 | 30 | 2.0 | 0.6 | 130–160 | ○ | ○ | ○ |
| 24 | 30 | 2.0 | 0.8 | 140–160 | ○ | ○ | Δ (I) |
| 25 | 30 | 0.18 | 1.2 | 140–160 | ○ | Δ | X (I) |
| 26 | 30 | 0.14 | 1.0 | 130–140 | ○ | ○ | Δ (I) |

TABLE 4-continued

| Example | Exposure time (sec) | Developing solution concentration (%) | Re-[1] solution (μm) | Lens-formable temperature (°C.) | Heat-deformation resistance (—) | Transparency (—) | Solvent resistance (—) |
|---|---|---|---|---|---|---|---|
| 27 | 30 | 0.16 | 1.0 | 120–140 | ○ | ○ | Δ (A) X (I) |
| 28 | 30 | 0.20 | 0.8 | 150–160 | ○ | ○ | ○ |
| 29 | 20 | 0.18 | 0.8 | 140–170 | ○ | ○ | ○ |
| 30 | 20 | 0.16 | 1.0 | 140–170 | ○ | ○ | ○ |

[1]Resolution means the resolvable minimum space width.

Examples 31–42

Radiation-sensitive solutions were prepared by further dissolving 0.125 g of imidazole 2E4MZ-CN (supplied by Shikoku Kasei Kogyo K.K.) in the radiation-sensitive solutions obtained in Examples 19 to 30, and filtering the resultant solutions through a millipore filter having a pore size of 0.22 μm. The so-prepared radiation-sensitive solutions were evaluated in the same manner as in Example 19. Table 5 shows the results.

TABLE 5

| Example | Exposure time (sec) | Developing solution concentration (%) | Re-[1] solution (μm) | Lens-formable temperature (°C.) | Heat-deformation resistance (—) | Transparency (—) | Solvent resistance (—) |
|---|---|---|---|---|---|---|---|
| 31 | 30 | 0.12 | 0.8 | 150–170 | ○ | ○ | ○ |
| 32 | 30 | 0.40 | 0.8 | 150–160 | ○ | ○ | ○ |
| 33 | 10 | 1.0 | 0.8 | 130–160 | ○ | ○ | ○ |
| 34 | 10 | 2.0 | 0.6 | 130–160 | ○ | ○ | ○ |
| 35 | 10 | 2.0 | 0.6 | 130–160 | ○ | ○ | ○ |
| 36 | 30 | 2.0 | 0.8 | 140–160 | ○ | ○ | ○ |
| 37 | 30 | 0.18 | 1.2 | 140–160 | ○ | Δ | ○ |
| 38 | 30 | 0.14 | 1.0 | 130–140 | ○ | ○ | ○ |
| 39 | 40 | 0.16 | 1.0 | 120–140 | ○ | ○ | ○ |
| 40 | 30 | 0.20 | 0.8 | 150–160 | ○ | ○ | ○ |
| 41 | 20 | 0.18 | 0.8 | 140–170 | ○ | ○ | ○ |
| 42 | 20 | 0.20 | 1.0 | 150–170 | ○ | ○ | ○ |

[1]Meaning as indicated in Table 4.

Examples 43–54

Radiation-sensitive solutions were prepared by further dissolving 0.125 g of Irgacure 261 (supplied by Ciba-Geigy) in the radiation-sensitive solutions obtained in Examples 19 to 30, and filtering the resultant solutions through a millipore filter having a pore size of 0.22 μm. The so-prepared radiation-sensitive solutions were evaluated in the same manner as in Example 19. Table 6 shows the results.

Example 55

25 Grams of the alkali-soluble polymer obtained in Synthesis Example 10(2) was dissolved in 75 g of diethylene glycol dimethyl ether, and then 7.5 g of 1,2-naphthoquinonediazide-5-sulfonic acid ester of 4,4'-[1-[4-(1-(4-hydroxyphenyl)-1-methylethyl)phenyl]ethylidene]-diphenol (average esterification ratio 66.7 mol %) and 2.5 g of a cresol novolak type epoxy resin, EOCN-1020 (supplied by Nippon Kayaku Co., Ltd) were dissolved.

The resultant solution was filtered through a millipore filter having a pore size of 0.2 μm to give a radiation-sensitive acid-forming compound. The so-obtained radiation-sensitive acid-forming compound was evaluated in the same manner as in Example 19.

Example 56

A radiation-sensitive acid-forming compound was prepared in the same manner as in Example 55 except that the alkali-soluble polymer was replaced with 25 g of the alkali-soluble polymer obtained in Synthesis Ex-

TABLE 6

| Example | Exposure time (sec) | Developing solution concentration (%) | Re-[1] solution (μm) | Lens-formable temperature (°C.) | Heat-deformation resistance (—) | Transparency (—) | Solvent resistance (—) |
|---|---|---|---|---|---|---|---|
| 43 | 30 | 0.12 | 0.8 | 150–170 | ○ | ○ | Δ (I) |
| 44 | 30 | 0.40 | 0.8 | 150–160 | ○ | ○ | Δ (I) |
| 45 | 10 | 1.0 | 0.8 | 130–160 | ○ | ○ | Δ~○ (I) |
| 46 | 10 | 2.0 | 0.6 | 130–160 | ○ | ○ | ○ |
| 47 | 10 | 2.0 | 0.6 | 130–160 | ○ | ○ | ○ |
| 48 | 30 | 2.0 | 0.8 | 140–160 | ○ | ○ | ○ |
| 49 | 30 | 0.18 | 1.2 | 140–160 | ○ | Δ | X (I) |
| 50 | 30 | 0.14 | 1.0 | 130–140 | ○ | ○ | ○ |
| 51 | 40 | 0.16 | 0.8 | 120–140 | ○ | ○ | Δ (I) |
| 52 | 30 | 0.20 | 1.0 | 150–170 | ○ | ○ | ○ |
| 53 | 20 | 0.20 | 0.8 | 140–170 | ○ | ○ | ○ |
| 54 | 20 | 0.22 | 0.8 | 140–170 | ○ | ○ | ○ |

[1]Meaning as indicated in Table 4.

ample 11(2), and a microfocusing lens was prepared and evaluated in the same manner as in Example 19.
Table 7 shows the results.

Example 57

A radiation-sensitive acid-forming compound was prepared in the same manner as in Example 55 except that the alkali-soluble polymer was replaced with 25 g of the alkali-soluble polymer obtained in Synthesis Example 12(2), and a microfocusing lens was prepared and evaluated in the same manner as in Example 55.
Table 7 shows the results.

Example 58

A radiation-sensitive acid-forming compound was prepared in the same manner as in Example 55 except that the 1,2-naphthoquinonediazide-5-sulfonic acid ester of 4,4'-[1-[4-(1-(4-hydroxyphenyl)-1-methylethyl)-phenyl]-ethylidene]diphenol (average esterification ratio 66.7 mol %) was replaced with 7.5 g of 1,1,3-tris(2,5-dimethyl-4-hydroxyphenyl)-3-phenylpropane, and a microfocusing lens was prepared and evaluated in the same manner as in Example 55. Table 7 shows the results.

Example 59

A radiation-sensitive acid-forming compound was prepared in the same manner as in Example 55 except that the alkali-soluble polymer was replaced with 25 g of the alkali-soluble polymer obtained in Synthesis Example 10(1), and a microfocusing lens was prepared and evaluated in the same manner as in Example 55.
Table 7 shows the results.

(supplied by Nippon Kayaku Co., Ltd) was replaced with 7.5 g of Epikote 807 (supplied by Yuka Shell Epoxy Kabushiki Kaisha), and a microfocusing lens was prepared and evaluated in the same manner as in Example 55.
Table 8 shows the results.

Example 62

A radiation-sensitive acid-forming compound was prepared in the same manner as in Example 55 except that the cresol novolak type epoxy resin, EOCN-1020 (supplied by Nippon Kayaku Co., Ltd) was replaced with 7.5 g of Epikote 154 (supplied by Yuka Shell Epoxy Kabushiki Kaisha), and a microfocusing lens was prepared and evaluated in the same manner as in Example 55.
Table 8 shows the results.

Example 63

A radiation-sensitive acid-forming compound was prepared in the same manner as in Example 55 except that the cresol novolak type epoxy resin, EOCN-1020 (supplied Nippon Kayaku Co., Ltd) was replaced with 7.5 g of CY-177 (supplied by Ciba-Geigy), and a microfocusing lens was prepared and evaluated in the same manner as in Example 55.
Table 8 shows the results.

Example 64

A radiation-sensitive acid-forming compound was prepared in the same manner as in Example 55 except that the cresol novolak type epoxy resin, EOCN-1020 (supplied by Nippon Kayaku Co., Ltd) was replaced

TABLE 7

| Example | Exposure time (sec) | TMAH (%) | Resolution ($\mu$m) | Lens-forming temperature (°C.) | Heat resistance (—) | Solvent resistance (—) | Refractive index (—) | Transparency (—) |
|---|---|---|---|---|---|---|---|---|
| 55 | 15 | 1.8 | 0.6 | 130–160 | ○ | ○ | 1.62 | ○ |
| 56 | 17 | 2.0 | 0.8 | 140–160 | ○ | Δ (I) | 1.62 | Δ |
| 57 | 17 | 2.0 | 0.6 | 140–160 | ○ | Δ (I) | 1.62 | Δ |
| 58 | 15 | 1.8 | 0.6 | 140–160 | ○ | ○ | 1.64 | ○ |
| 59 | 15 | 1.8 | 0.6 | 130–160 | ○ | ○ | 1.58 | ○ |

*Resolution means the resolvable minimum space width.

Example 60

A radiation-sensitive acid-forming compound was prepared in the same manner as in Example 55 except that the cresol novolak type epoxy resin, EOCN-1020 (supplied by Nippon Kayaku Co., Ltd) was replaced with 7.5 g of Epikote 1010 (supplied by Yuka Shell Epoxy Kabushiki Kaisha), and a microfocusing lens was prepared and evaluated in the same manner as in Example 55.
Table 8 shows the results.

Example 61

A radiation-sensitive acid-forming compound was prepared in the same manner as in Example 55 except that the cresol novolak type epoxy resin, EOCN-1020 with 7.5 g of Epikote 872 (supplied by Yuka Shell Epoxy Kabushiki Kaisha), and a microfocusing lens was prepared and evaluated in the same manner as in Example 55.
Table 8 shows the results.

Example 65

A radiation-sensitive acid-forming compound was prepared in the same manner as in Example 55 except that the cresol novolak type epoxy resin, EOCN-1020 (supplied by Nippon Kayaku Co., Ltd) was replaced with 7.5 g of Optmer SS (supplied by Japan Synthetic Rubber Co., Ltd), and a microfocusing lens was prepared and evaluated in the same manner as in Example 55.
Table 8 shows the results.

TABLE 8

| Example | Exposure time (sec) | TMAH (%) | Resolution ($\mu$m) | Lens-forming temperature (°C.) | Heat resistance (—) | Solvent resistance (—) | Refractive index (—) | Transparency (—) |
|---|---|---|---|---|---|---|---|---|
| 60 | 15 | 1.8 | 0.6 | 130–160 | ○ | ○ | 1.63 | ○ |
| 61 | 17 | 2.0 | 0.8 | 140–160 | ○ | ○ | 1.62 | Δ |

TABLE 8-continued

| Example | Exposure time (sec) | TMAH (%) | Resolution (μm) | Lens-forming temperature (°C.) | Heat resistance (—) | Solvent resistance (—) | Refractive index (—) | Transparency (—) |
|---|---|---|---|---|---|---|---|---|
| 62 | 17 | 2.0 | 0.6 | 140–160 | ◯ | Δ (I) | 1.62 | Δ |
| 63 | 17 | 1.8 | 1.0 | 140–160 | ◯ | ◯ | 1.61 | Δ |
| 64 | 17 | 2.0 | 0.8 | 130–160 | ◯ | Δ (I) | 1.61 | ◯ |
| 65 | 20 | 1.8 | 0.6 | 130–160 | ◯ | ◯ | 1.63 | ◯ |

*Resolution means the removable minimum space width.

Example 66

A radiation-sensitive acid-forming compound was prepared by further dissolving 0.075 g of imidazole 2E4MZ-CN (supplied by Shikoku Kasei Kogyo K.K.) in the radiation-sensitive acid-forming compound prepared in Example 55, and a microfocusing lens was prepared and evaluated in the same manner as in Example 55.

Table 9 shows the results.

Example 67

A radiation-sensitive acid-forming compound was prepared by further dissolving 0.10 g of an optical cation polymerization initiator, Irgacure 261 ((supplied by Ciba-Geigy) in the radiation-sensitive acid-forming compound prepared in Example 55, and a microfocusing lens was prepared and evaluated in the same manner as in Example 55.

Table 9 shows the results.

TABLE 9

| Example | Exposure time (sec) | TMAH (%) | Resolution (μm) | Lens-forming temperature (°C.) | Heat resistance (—) | Solvent resistance (—) | Refractive index (—) | Transparency (—) |
|---|---|---|---|---|---|---|---|---|
| 66 | 15 | 2.0 | 0.8 | 140–160 | ◯ | ◯ | 1.63 | ◯ |
| 67 | 20 | 2.2 | 0.6 | 130–160 | ◯ | ◯ | 1.63 | ◯ |

*Resolution means the resolvable minimum space width.

Conventionally, that portion of an overcoat which is unnecessary is required to be removed by dry-etching, and there are therefore problems in that the panel production step is complicated and that a defect occurs on a display device due to the dry etching. In contrast, the above problems can be overcome by the radiation-sensitive resin composition of the present invention, which enables the removal of an unnecessary portion by exposure and development while satisfying the various properties required of an overcoat.

further, conventional photosensitive resins for a microfocusing lens do not give any microfocusing lens that is sufficient in heat deformation resistance and solvent resistance. In contrast, the above problem can be overcome by the radiation-sensitive resin composition of the present invention, which enables the curing reaction in forming a lens so sufficiently to give a lens having sufficient heat deformation resistance and solvent resistance.

What is claimed is:

1. A radiation-sensitive resin composition comprising an admixture of:
   (a) at least one epoxy group-containing alkali-soluble resin selected from the group consisting of
   (a1) an epoxy group-containing alkali-soluble resin which consists essentially of a structural unit of the formula (a)-1,

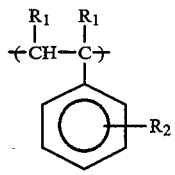

in which two $R_1$'s are identical with, or different from, each other and each is a hydrogen atom or an alkyl group having 1 to 4 carbon atoms, and $R_2$ is a hydrogen atom, a methyl group or a methoxy group, a structural unit of the formula (a)-2,

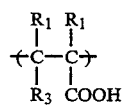

in which $R_1$ is as defined above, and $R_3$ is a hydrogen atom or a carboxyl group, a structural unit of the formula (a)-3,

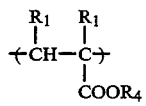

in which $R_1$ is as defined above, and $R_4$ is an alkyl group having 1 to 20 carbon atoms, a cycloalkyl group having 5 to 20 carbon atoms, or an aryl group having 6 to 12 carbon atoms, and a structural unit of the formula (a)-4,

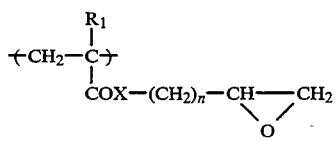

in which $R_1$ is as defined above, X is —O— or a group of the following formula

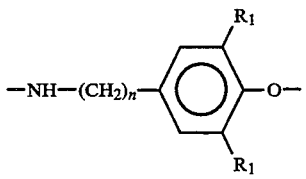

(wherein $R_1$ and n are defined as above), and n is an integer of 1 to 10, and (a1)' an epoxy group-containing alkali-soluble resin comprising the above structural units (a)-1, (a)-3, (a)-4 and a structural unit of the formula (a)-5,

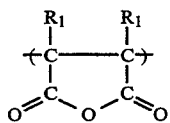

wherein $R_1$ is defined as above, (b) 1,2-naphthoquinonediazide sulfonic acid ester, and (c) a solvent.

2. A resin composition according to claim 1, wherein the epoxy group-containing alkali-soluble resin is the above resin (a1) and on the basis of the total weight of the above structural units (a)-1, (a)-2, (a)-3 and (a)-4, the total amount of the structural units (a)-1 and (a)-3 is 10 to 70% by weight, the amount of the structural unit (a)-2 is 5 to 40% by weight, and the amount of the structural unit (a)-4 is 10 to 70% by weight.

3. A resin composition according to claim 1, wherein the epoxy group-containing alkali-soluble resin is the above resin (a1)' and on the basis of the total weight of the structural units (a)-1, (a)-3, (a)-4 and (a)-5, the total weight of the structural units (a)-1 and (a)-3 is 10 to 70% by weight, the amount of the structural unit (a)-5 is 5 to 40% by weight, and the amount of the structural unit (a)-4 is 10 to 70% by weight.

4. A resin composition according to claim 1, wherein the 1,2-naphthoquinonediazide sulfonic acid ester (b) is a compound of the formula (b)-1,

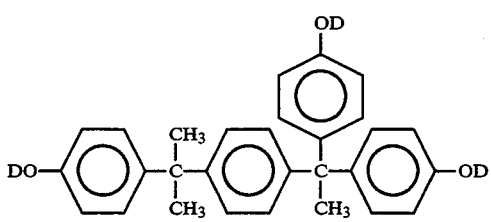

wherein D's are hydrogen atoms, 1,2-naphthoquinonediazide-4-sulfonyl or 1,2-naphthoquinonediazide-5-sulfonyl, provided that all of D's cannot be hydrogen atoms, or a compound of the formula (b)-2,

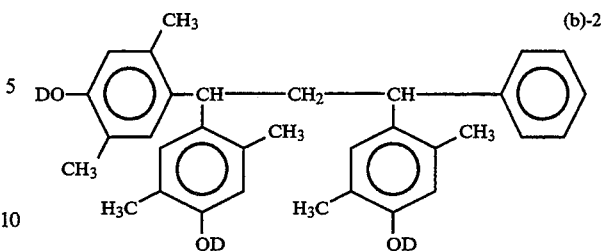

wherein D's are as defined above.

5. A radiation-sensitive resin composition according to claim 1, comprising an admixture of:

(a) at least one alkali-soluble resin selected from the group consisting of (a1) an epoxy group-containing alkali-soluble resin consisting essentially of the structural units of the formulae (a)-1, (a)-2, (a)-3 and (a)-4, and (a1)' an epoxy group-containing alkali-soluble resin comprising the structural units of the formulae (a)-1, (a)-3, (a)-4 and (a)-5, (d) an epoxy compound having at least two epoxy groups in the molecule, (b) 1,2-naphthoquinonediazide sulfonic acid ester, and (c) a solvent.

6. A resin composition according to claim 5, wherein the alkali-soluble resin is the above resin (a1) and on the basis of the total amount of the above structural units (a)-1, (a)-2, (a)-3 and (a)-4, the total weight of the structural units (a)-1 and (a)-3 is 10 to 70% by weight, the amount of the structural unit (a)-2 is 5 to 40% by weight, and the amount of the structural unit (a)-4 is 10 to 70% by weight.

7. A resin composition according to claim 5, wherein the alkali-soluble resin is the above resin (a1)' and on the basis of the total weight of the structural units (a)-1, (a)-3, (a)-4 and (a)-5, the total amount of the structural units (a)-1 and (a)-3 is 10 to 70% by weight, the amount of the structural unit (a)-5 is 5 to 40% by weight, and the amount of the structural unit (a)-4 is 10 to 70% by weight.

8. A radiation-sensitive resin composition according to claim 1, comprising an admixture of:

(a) at least one alkali-soluble resin selected from the group consisting of:

(a1) an epoxy group-containing alkali-soluble resin consisting essentially of the structural units of the formulae (a)-1, (a)-2, (a)-3 and (a)-4, and (a1)' an epoxy group-containing alkali-soluble resin consisting essentially of the structural units of the formulae (a)-1, (a)-3, (a)-4 and (a)-5, (b) 1,2-naphthoquinonediazide sulfonic acid ester, (c) a solvent, (d) a compound having at least two epoxy groups in the molecule, and (e) an alkali-soluble resin consisting essentially of the structural units of the formulae (a)-1, (a)-3 and a structural unit of the formula (a)-6

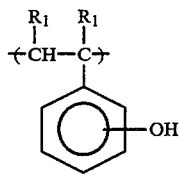

wherein $R_1$ is as defined above.

9. A radiation-sensitive resin composition according to claim 1, comprising an admixture of:
(a) at least one alkali-soluble resin selected from the group consisting of:
(a1) an epoxy group-containing alkali-soluble resin consisting essentially of the structural units of the formulae (a)-1, (a)-2, (a)-3 and (a)-4, and
(a1)' an epoxy group-containing alkali-soluble resin consisting essentially of the structural units of the formulae (a)-1, (a)-3, (a)-4 and (a)-5,
(b) 1,2-naphthoquinonediazide sulfonic acid ester,
(c) a solvent,
(d) a compound having at least two epoxy groups in the molecule,
(e) an alkali-soluble resin consisting essentially of the structural units of the formulae (a)-1, (a)-3 and a structural unit of the formula (a)-6

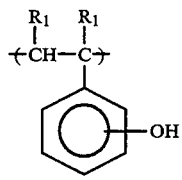

wherein $R_1$ is as defined above, and
(f) an alkali-soluble resin comprising a nuclear-bromination product of a homopolymer of the structural unit of the above formula (a)-6, or a nuclear-bromination product comprising the structural unit of the above formula (a)-6 and a structural unit of the formula (a)-7

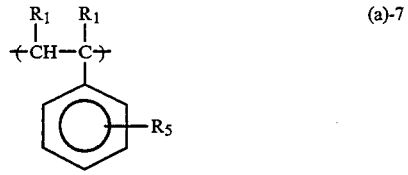

in which $R_1$ is as defined above, and $R_5$ is a hydrogen atom, a methyl group or a methoxy group.

10. A resin composition according to claim 8, wherein based on the total weight of the structural units (a)-1, (a)-3 and (a)-6 in the alkali-soluble resin (e), the total amount of the structural units (a)-1 and (a)-3 is 0 to 40% by weight and the amount of the structural unit (a)-6 is 60 to 100% by weight.

11. A resin composition according to claim 9, wherein based on the total weight of the structural units (a)-1, (a)-6 and (a)-7 in the alkali-soluble resin (f), the amount of the structural unit (a)-6 is at least 60% by weight.

12. A resin composition according to claim 5, wherein the epoxy compound (d) is selected from the group consisting of a bisphenol A type epoxy resin, a bisphenol F type epoxy resin, a phenol novolak type epoxy resin, a cresol novolak type epoxy resin, an alicyclic epoxy resin, a glycidyl ester-containing epoxy resin, a glycidylamine-containing epoxy resin, and a heterocyclic epoxy resin.

13. A resin composition according to claim 5, wherein the 1,2-naphthoquinonediazide sulfonic acid ester (b) is a compound of the formula (b)-1 or (b)-2.

* * * * *